United States Patent
Hanson et al.

(10) Patent No.: US 9,958,782 B2
(45) Date of Patent: May 1, 2018

(54) APPARATUS FOR POST EXPOSURE BAKE

(71) Applicant: Applied Materials, Inc., Santa Clara, CA (US)

(72) Inventors: Kyle M. Hanson, Kalispell, MT (US); Gregory J. Wilson, Kalispell, MT (US); Viachslav Babayan, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days. days.

(21) Appl. No.: 15/196,725

(22) Filed: Jun. 29, 2016

(65) Prior Publication Data

US 2018/0004094 A1   Jan. 4, 2018

(51) Int. Cl.

| | |
|---|---|
| *H01L 21/67* | (2006.01) |
| *C23C 16/50* | (2006.01) |
| *C23C 16/56* | (2006.01) |
| *G03F 7/38* | (2006.01) |
| *C23C 16/54* | (2006.01) |
| *H01L 21/677* | (2006.01) |

(52) U.S. Cl.
CPC .............. *G03F 7/38* (2013.01); *C23C 16/54* (2013.01); *C23C 16/56* (2013.01); *H01L 21/67011* (2013.01); *H01L 21/6719* (2013.01); *H01L 21/67751* (2013.01)

(58) Field of Classification Search
CPC .......... H01L 21/6838; C23C 16/4587
See application file for complete search history.

(56) References Cited

U.S. PATENT DOCUMENTS

| | | | |
|---|---|---|---|
| 4,228,358 A | * | 10/1980 | Ryding ............. H01L 21/67748 414/939 |
| 6,079,358 A | * | 6/2000 | Kim .................. C23C 16/45563 118/723 E |
| 6,261,744 B1 | | 7/2001 | Yoshioka |
| 6,686,132 B2 | | 2/2004 | Cheng et al. |
| 6,841,342 B2 | | 1/2005 | Nishi et al. |
| 6,875,466 B2 | | 4/2005 | Matsui et al. |
| 8,097,402 B2 | | 1/2012 | Scheer et al. |
| 8,288,174 B1 | | 10/2012 | Rathsack et al. |
| 2004/0206373 A1 | | 10/2004 | Donoso et al. |
| 2005/0074706 A1 | | 4/2005 | Bristol et al. |
| 2008/0050679 A1 | | 2/2008 | Salek et al. |

(Continued)

FOREIGN PATENT DOCUMENTS

WO    2008-085681 A2    7/2008

OTHER PUBLICATIONS

International Search Report and Written Opinion for International Application No. PCT/US2017/030511 dated Sep. 21, 2017.

*Primary Examiner* — Binu Thomas
(74) *Attorney, Agent, or Firm* — Patterson + Sheridan, LLP

(57) ABSTRACT

Embodiments described herein relate to methods and apparatus for performing immersion field guided post exposure bake processes. Embodiments of apparatus described herein include a chamber body defining a processing volume. Electrodes may be disposed adjacent the process volume and process fluid is provided to the process volume via a plurality of fluid conduits to facilitate immersion field guided post exposure bake processes. A post process chamber for rinsing, developing, and drying a substrate is also provided.

20 Claims, 5 Drawing Sheets

(56) References Cited

U.S. PATENT DOCUMENTS

| | | |
|---|---|---|
| 2008/0135207 A1 | 6/2008 | Fukuoka et al. |
| 2008/0304940 A1 | 12/2008 | Auer-Jongepier et al. |
| 2011/0061812 A1* | 3/2011 | Ganguly ............ H01L 21/68785 156/345.34 |
| 2011/0269314 A1 | 11/2011 | Lee et al. |
| 2013/0333616 A1 | 12/2013 | Klindworth et al. |
| 2016/0139503 A1 | 5/2016 | Ramaswamy et al. |
| 2017/0154797 A1* | 6/2017 | Babayan ............ H01L 21/68764 |

* cited by examiner

APPARATUS FOR POST EXPOSURE BAKE

BACKGROUND

Field

The present disclosure generally relates to methods and apparatus for processing a substrate, and more specifically to methods and apparatus for performing immersion field guided post exposure bake processes.

Description of the Related Art

Integrated circuits have evolved into complex devices that can include millions of components (e.g., transistors, capacitors and resistors) on a single chip. Photolithography is a process that may be used to form components on a chip. Generally the process of photolithography involves a few basic stages. Initially, a photoresist layer is formed on a substrate. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, for example, a 193 nm ArF laser, an electron beam, an ion beam, or other suitable source.

In an exposure stage, a photomask or reticle may be used to selectively expose certain regions of the substrate to electromagnetic radiation. Other exposure methods may be maskless exposure methods. Exposure to light may decompose the photo acid generator, which generates acid and results in a latent acid image in the resist resin. After exposure, the substrate may be heated in a post-exposure bake process. During the post-exposure bake process, the acid generated by the photoacid generator reacts with the resist resin, changing the solubility of the resist during the subsequent development process.

After the post-exposure bake, the substrate, particularly the photoresist layer, may be developed and rinsed. Depending on the type of photoresist used, regions of the substrate that were exposed to electromagnetic radiation may either be resistant to removal or more prone to removal. After development and rinsing, the pattern of the mask is transferred to the substrate using a wet or dry etch process.

The evolution of chip design continually requires faster circuitry and greater circuit density. The demands for greater circuit density necessitate a reduction in the dimensions of the integrated circuit components. As the dimensions of the integrated circuit components are reduced, more elements are required to be placed in a given area on a semiconductor integrated circuit. Accordingly, the lithography process must transfer even smaller features onto a substrate, and lithography must do so precisely, accurately, and without damage. In order to precisely and accurately transfer features onto a substrate, high resolution lithography may use a light source that provides radiation at small wavelengths. Small wavelengths help to reduce the minimum printable size on a substrate or wafer. However, small wavelength lithography suffers from problems, such as low throughput, increased line edge roughness, and/or decreased resist sensitivity.

In a recent development, an electrode assembly is utilized to generate an electric field to a photoresist layer disposed on the substrate prior to or after an exposure process so as to modify chemical properties of a portion of the photoresist layer where the electromagnetic radiation is transmitted to for improving lithography exposure/development resolution. However, the challenges in implementing such systems have not yet been adequately overcome.

Therefore, there is a need for improved methods and apparatus for improving immersion field guided post exposure bake processes.

SUMMARY

In one embodiment, a substrate processing apparatus is provided. The apparatus includes a chamber body defining a process volume. A major axis of the process volume is oriented vertically and a minor axis of the process volume is oriented horizontally. A moveable door is coupled to the chamber body and a first electrode is coupled to the door. The first electrode is configured to support a substrate thereon. A second electrode is coupled to the chamber body and the second electrode at least partially defines the process volume. A first plurality of fluid ports are formed in a sidewall of the chamber body adjacent the process volume and a second plurality of fluid ports are formed in the sidewall of the chamber body adjacent the process volume opposite the first plurality of fluid ports.

In another embodiment, a substrate processing apparatus is provided. The apparatus includes a chamber body defining a process volume and a rotatable pedestal disposed within the process volume. A fluid delivery arm is configured to deliver cleaning fluid to the process volume. The apparatus also includes a shield capable of being raised and lowered by a motor and the shield is disposed radially outward of the rotatable pedestal.

In yet another embodiment, a method of processing a substrate is provided. The method includes positioning a substrate adjacent a process volume in a process chamber and delivering a process fluid to the process volume at a first flow rate. After filling a portion of the process volume with process fluid, the process fluid is delivered to the process volume at a second flow rate greater than the first flow rate. After completely filling the process volume with process fluid, the process fluid is delivered to the process volume at a third flow rate less than the second flow rate. An electric field is generated in the process volume during the delivery of the process fluid to the process volume at the third flow rate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
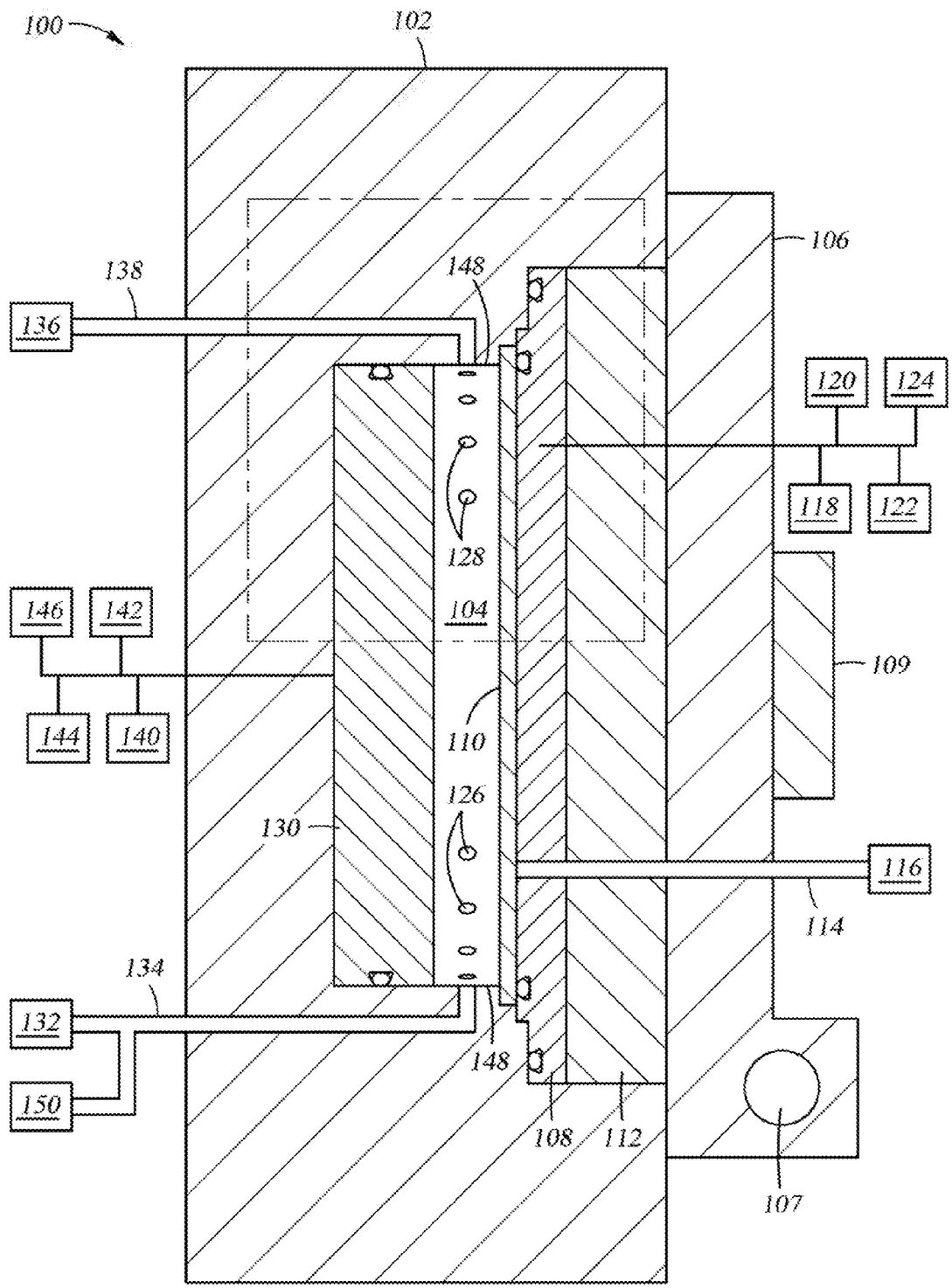
FIG. 1 illustrates a schematic, cross-sectional view of a process chamber according to embodiments described herein.

FIG. 1 illustrates a schematic, cross-sectional view of a process chamber 100 according to embodiments described herein. In one embodiment, the process chamber 100 is configured for performing immersion field guided post exposure bake (iFGPEB) processes. The chamber 100 is positioned in a vertical orientation such that when a substrate is being processed, a major axis of the substrate is oriented vertically and a minor axis of the substrate is oriented horizontally. The chamber 100 includes a chamber body 102, which is manufactured from a metallic material, such as aluminum, stainless steel, and alloys and combinations thereof. Alternatively, the chamber body 102 is manufactured from polymer materials, such as polytetrafluoroethylene (PTFE), or high temperature plastics, such as polyether ether ketone (PEEK).

The body 102 defines, at least partially, a process volume 104 therein. For example, a sidewall 148 of the body 102 defines a diameter of the process volume 104. A major axis of the process volume 104 is oriented vertically and a minor axis of the process volume 104 is oriented horizontally. A first plurality of fluid ports 126 are formed in the chamber body 102 through the sidewall 148. A second plurality of fluid ports 128 are also formed in the sidewall 148 of the chamber body 102 opposite the first plurality of fluid ports 126. The first plurality of fluid ports 126 are in fluid communication with a process fluid source 132 via first conduit 134. The second plurality of fluid ports 128 are in fluid communication with a fluid outlet 136 via a second conduit 138. The process fluid source 132, either alone or in combination with other apparatus, is configured to preheat process fluid to a temperature of between about 70° C. and about 130° C., such as about 110° C., prior to the fluid entering the process volume 104.

In one embodiment, a purge gas source 150 is also in fluid communication with the process volume 104 via the first fluid conduit 134 and the first plurality of fluid ports 126. Gases provided by the purge gas source 150 may include nitrogen, hydrogen, inert gases and the like to purge the processing volume 104 during or after iFGPEB processing. When desired, purge gases may be exhausted from the processing volume 104 via the fluid outlet 136.

A door 106 is operably coupled to the chamber body 102. In the illustrated embodiment, the door 106 is oriented in a processing position such that the door 106 is disposed adjacent to and abuts the chamber body 102. The door 106 is formed from materials similar to the materials selected for the chamber body 102. Alternatively, the chamber body may be formed from a first material, such as a polymeric material, and the door 106 may be formed from a second material different from the first material, such as a metallic material. A shaft 107 extends through the door 106 and provides an axis (i.e. the Z-axis) about which the door 106 rotates to open and close the door 106.

The door 106 may be coupled to a track (not shown) and the door 106 is configured to translate along the track in the X-axis. A motor (not shown) may be coupled to the door 106 and/or the track to facilitate movement of the door 106 along the X-axis. Although the door 106 is illustrated in a closed processing position, opening and closing of the door 106 may be performed by moving the door 106 away from the chamber body 02 along the X-axis prior to rotating the door 106 about the Z-axis. For example, the door 106 may rotate about 90° from the illustrated processing position to a loading position such that positioning of a substrate 110 on a first electrode 108 can be performed with a reduced probability of substrate breakage during loading.

A backing plate 112 is coupled to the door 106 and the first electrode 108 is coupled to the backing plate 112. The backing plate 112 is formed from materials similar to the door 106 or the chamber body 102, depending on the desired implementation. The first electrode 108 may be formed from an electrically conductive metallic material. In addition, the material utilized for the first electrode 108 may be a non-oxidative material. The materials selected for the first electrode 108 provide for desirable current uniformity and low resistance across the surface of the first electrode 108. In certain embodiments, the first electrode 108 is a segmented electrode configured to introduce voltage non-uniformities across the surface of the first electrode 108. In this embodiment, a plurality of power sources are utilized to power different segments of the first electrode 108.

The first electrode 108 is sized to accommodate attachment of the substrate 110 thereon. The first electrode 108 is also sized to allow for positioning adjacent the chamber body 102 and the process volume 104. In one embodiment, the first electrode 108 is fixably coupled to the backing plate 112 and the door 106. In another embodiment, the first electrode 108 is rotatably coupled to the backing plate 112 and the door 106. In this embodiment, a motor 109 is coupled to the door 106 and is configured to impart rotational movement on either the backing plate 112 or the first electrode 108. In one embodiment, the first electrode 108 is configured as a ground electrode.

A vacuum source 116 is in fluid communication with a substrate receiving surface of the first electrode 108. The vacuum source 116 is coupled to a conduit 114 which extends from the vacuum source 116 through the door 106, the backing plate 112, and the first electrode 108. Generally, the vacuum source 116 is configured to vacuum chuck the substrate 110 to the first electrode 108.

A heat source 118, a temperature sensing apparatus 120, a power source 122, and a sensing apparatus 124 are coupled to the first electrode 108. The heat source 118 provides power to one or more heating elements, such as resistive heaters, disposed within the first electrode 108. It is also contemplated that the heat source 118 may provide power to heating elements disposed within the backing plate 112. The heat source 118 is generally configured to heat either the first electrode 108 and/or or the backing plate 112 to facilitate preheating of fluid during iFGPEB processes. The heat source 118 may also be utilized to maintain a desired temperature of the process fluid during substrate processing in addition to or distinct from preheating the process fluid. In one embodiment, the heat source 118 is configured to heat the first electrode 108 to a temperature of between about 70° C. and about 130° C., such as about 110° C.

The temperature sensing apparatus 120, such as a thermocouple or the like, is communicatively coupled to the heat source 118 to provide temperature feedback and facilitate heating of the first electrode 108. The power source 122 is configured to supply, for example, between about 1 V and about 20 kV to the first electrode 108. Depending on the type of process fluid utilized, current generated by the power source 122 may be on the order of tens of nano-amps to hundreds of milliamps. In one embodiment, the power source 122 is configured to generate electric fields ranging from about 1 kV/m to about 2 MV/m. In some embodiments, the power source 122 is configured to operate in either voltage controlled or current controlled modes. In both modes, the power source may output AC, DC, and/or pulsed DC waveforms. Square or sine waves may be utilized if desired. The power source 122 may be configured to provide power at a frequency of between about 0.1 Hz and about 1 MHz, such as about 5 kHz. The duty cycle of the pulsed DC power or AC power may be between about 5% and about 95%, such as between about 20% and about 60%.

The rise and fall time of the pulsed DC power or AC power may be between about 1 ns and about 1000 ns, such as between about 10 ns and about 500 ns. The sensing apparatus 124, such as a voltmeter or the like, is communicatively coupled to the power source 122 to provide electrical feedback and facilitate control of the power applied to the first electrode 108. The sensing apparatus 124 may also be configured to sense a current applied to the first electrode 108 via the power source 122.

A second electrode 130 is coupled to the chamber body 102 adjacent the process volume 104 and partially defined the process volume 104. Similar to the first electrode 108, the second electrode 130 is coupled to a heat source 140, a temperature sensing apparatus 142, a power source 144, and a sensing apparatus 146. The heat source 140, a temperature sensing apparatus 142, a power source 144, and a sensing apparatus 146 may function similarly to the heat source 118, a temperature sensing apparatus 120, a power source 122, and a sensing apparatus 124. In one embodiment, the second electrode 130 is an actively powered electrode and the first electrode 108 is a ground electrode. As a result of the aforementioned electrode arrangement, acid generated upon exposure of a resist disposed on the substrate 110 may be modulated during iFGPEB processing to improve patterning and resist de-protection characteristics.

Figure 2:
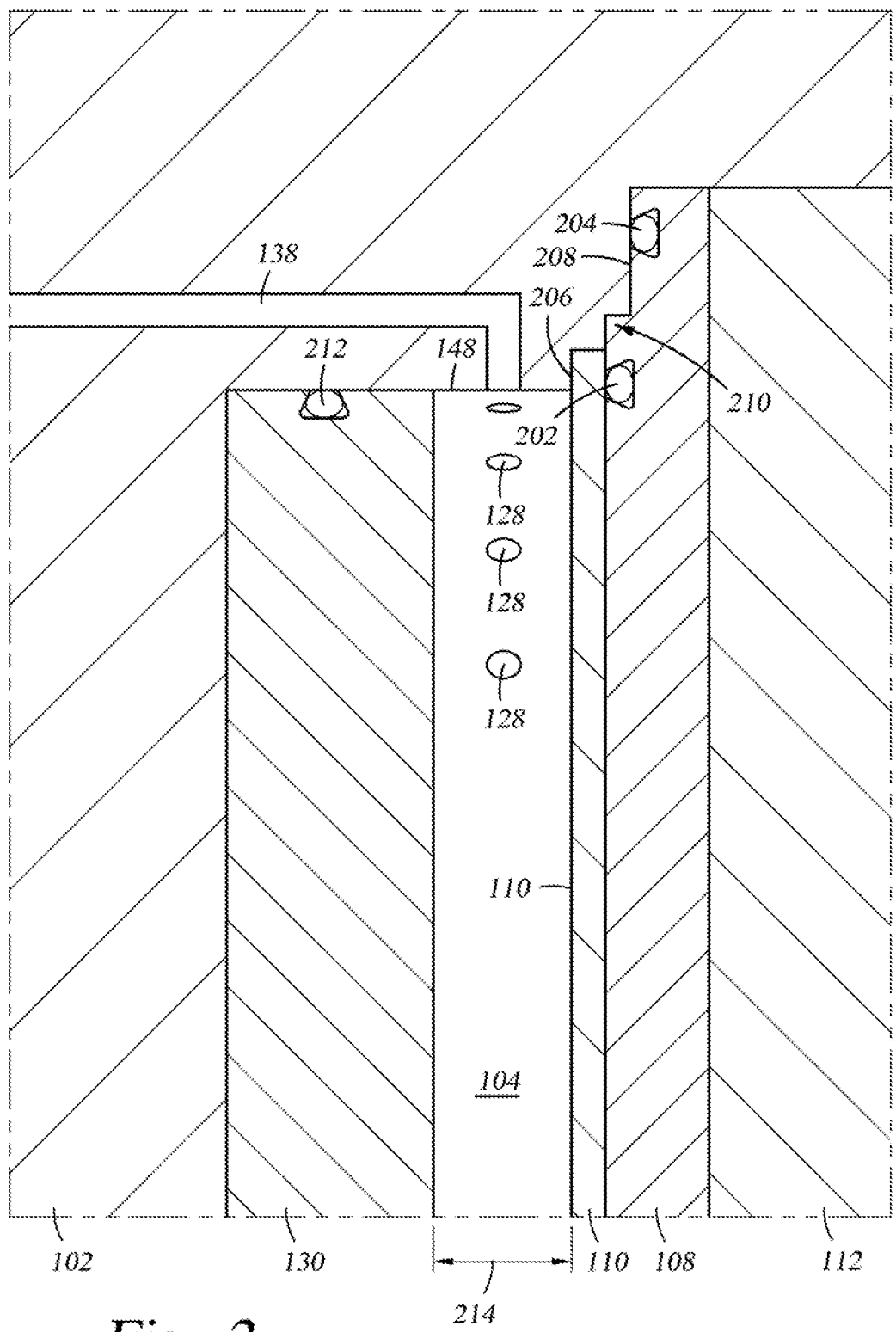
FIG. 2 illustrates a detailed view of a portion of the process chamber of FIG. 1 according to embodiments described herein.

FIG. 2 illustrates a detailed view of a portion of the process chamber 100 of FIG. 1 according to embodiments described herein. The process volume 104 has a width 214 defined between the substrate 110 and the second electrode 130. In one embodiment, the width 214 of the process volume 104 is between about 1.0 mm and about 10 mm, such as between about 4.0 mm and about 4.5 mm. The relatively small gap between the substrate 110 and the second electrode 130 reduces the volume of the process volume 104 which enables utilization of reduced quantities of process fluid during iFGPEB processing. In addition, the width 214, which defines a distance between the second electrode 130 and the substrate, is configured to provide for a substantially uniform electrical field across the surface of the substrate 110. The substantially uniform field provides for improved patterning characteristics as a result of iFG-PEB processing. Another benefit of the gap having the width 214 is a reduction in voltage utilized to generate the desired electrical field.

In operation, the process volume 104 is filled with process fluid during iFGPEB processing. To reduce the probability of process fluid leakage out of the process volume, a plurality of O-rings are utilized to maintain the fluid containment integrity of the process volume. A first O-ring 202 is disposed in the first electrode 108 on the substrate receiving surface of the first electrode 108. The first O-ring 202 may be positioned on the first electrode radially inward from an outer diameter of the substrate 110.

In one example, the first O-ring 202 is positioned on the first electrode 108 a distance between about 1 mm and about 10 mm radially inward from the outer diameter of the substrate 110. The first O-ring is positioned to contact the backside of the substrate 110 when the substrate is chucked to the first electrode 108. A first surface 206 of the sidewall 148 is shaped and sized to contact an edge region of the substrate 110 when the substrate 110 is in the illustrated processing position.

In one embodiment, the first O-ring 202 is disposed in the first electrode 108 opposite the first surface 206 of the sidewall 148. It is contemplated that the first O-ring 202 may prevent the leakage of process fluid from the process volume 104 to a region behind the substrate 110, such as the substrate supporting surface of the first electrode 108. Advantageously, vacuum chucking of the substrate 110 is maintained and process fluid is prevented from reaching the vacuum source 116.

The first electrode 108 has a ledge 210 disposed radially outward of the first O-ring. The ledge 210 is disposed radially outward from the position of the first O-ring 202. A second O-ring 204 is coupled to the first electrode 108 radially outward of the ledge 210. A second surface 208 of the sidewall 148 is shaped and sized to contact the first electrode 108 adjacent to and extending radially inward from the outer diameter of the first electrode 108. In one embodiment, the second O-ring 204 is disposed in contact with the second surface 208 of the sidewall 148 when the substrate 110 is disposed in a processing position. It is contemplated that the second O-ring 204 may prevent the leakage of process fluid from the process volume 108 beyond the outer diameter of the first electrode 108.

A third O-ring 212 is coupled to the second electrode 130 along an outer diameter of the second electrode 130. The third O-ring 212 is also disposed in contact with the sidewall 148 of the chamber body 102. The third O-ring 212 is configured to prevent process fluid from flowing behind the second electrode 130. Each of the O-rings 202, 204, 212 are formed from an elastomeric material, such as a polymer or the like. In one embodiment, the O-rings 202, 204, 212 have a circular cross-section. In another embodiment, the O-rings 202, 204, 212 have a non-circular cross-section, such as a triangular cross section or the like. It is also contemplated that each of the O-rings 202, 204, 212 are subjected to a compressive force suitable to prevent the passage of process fluid beyond the O-rings 202, 204, 212 and fluidly seal the process volume 104.

Figure 3:
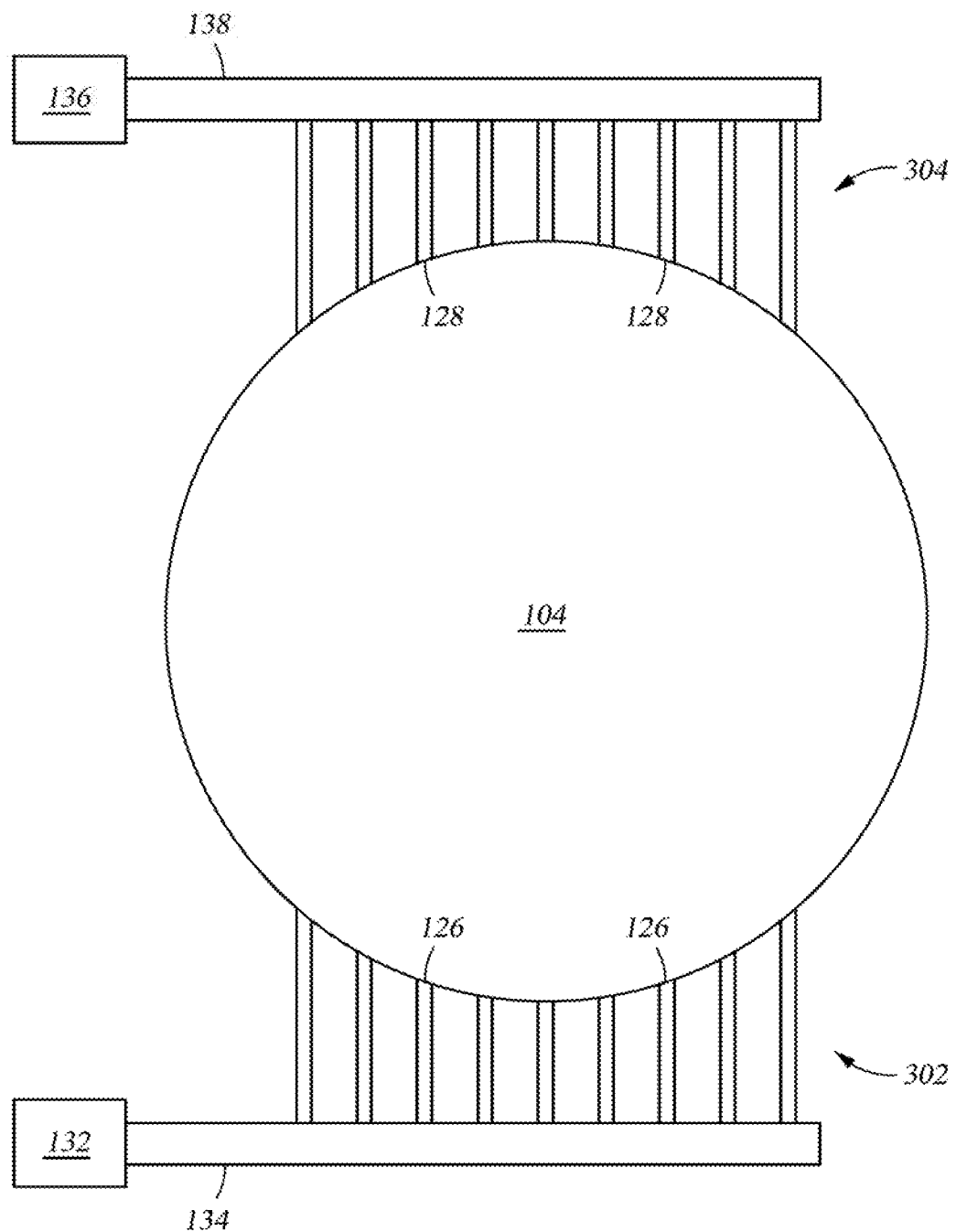
FIG. 3 illustrates a schematic, side view of various components of the process chamber of FIG. 1 according to embodiments described herein.

FIG. 3 illustrates a schematic, side view of various components of the process chamber 100 of FIG. 1 according to embodiments described herein. The process volume 104 is illustrated with the first plurality of fluid ports 126 and the second plurality of fluid ports 128 formed therein. A first plurality of channels 302 are coupled between the first plurality of fluid ports 126 and the first conduit 134. A second plurality of channels 304 are coupled between the second plurality of fluid ports 128 and the second conduit 138.

While 10 channels of the first plurality of channels 302 are illustrated, it is contemplated that between about 5 channels and about 30 channels may be implemented, for example, between about 9 channels and about 21 channels. Similarly, between about 5 channels and about 30 channels may be utilized for the second plurality of channels 304, for example, between about 9 channels and about 21 channels. The number of channels 302, 304 are selected to enable suitable fluid flow rates during filling of the process volume 104. The channels 302, 304 are also configured to maintain the rigidity of the process volume 104 when the first electrode 108 and substrate 110 are positioned against the first surface 206 of the chamber body 102. In one embodiment, 9 first channels 302 and 9 second channels 304 are coupled to the process volume 104. In another embodiment, 21 first channels 302 and 21 second channels 304 are coupled to the first process volume 104.

The first plurality of channels 302 and the second plurality of channels 304 are formed in the body 102 of the process chamber 100. Each of the first and second plurality of channels 302, 304 has a diameter at the first fluid ports 126 and second fluid ports 128, respectively, of between about 3.0 mm and about 3.5 mm, such as about 3.2 mm. In another embodiment, the diameter of each channel along the diameter of the process volume 104 is different. In one embodiment, the channels of the first plurality of channels 302 are evenly spaced across the diameter of the process volume 104. Similarly, the channels of the second plurality of channels 304 are evenly spaced across the diameter of the process volume 104. It is also contemplated that the channels of the first and second plurality of channels 302, 304 may also be unevenly spaced across the diameter of the process volume 104.

The spacing of the channels of the first and second plurality of channels 302, 304 is configured to reduce turbulence of the process fluid entering and exiting the process volume 104. Because turbulence generates bubbles in the process fluid and bubbles act as insulators within the subsequently applied electric field, measures are taken to reduce the formation of bubbles. As described in detail below, flow rates of process fluid are modulated, in combination with the design of the first and second plurality of channels 302, 304, to reduce turbulence.

A flow path of process fluid originates from the process fluid source 132 and travels through the first conduit 134 into the first plurality of channels 302. The fluid exits the first plurality of channels 302 via the first fluid ports 126 into the process volume 104. Once the process volume 104 is filled with process fluid, the process fluid exits the process volume 104 via the second fluid ports 128 into the second plurality of channels 304. The process fluid continues into the second conduit 138 and is ultimately removed from the process chamber 100 in the fluid outlet 136.

In one operational embodiment, a first flow rate utilized to fill the process volume 104 with process fluid prior to activation of an electric field is between about 5 L/min and about 10 L/min. Once the process volume 104 is filled with process fluid, the electric field is applied and a second flow rate of process fluid between about 0 L/min and about 5 L/min is utilized during iFGPEB processing. The process fluid fill and processing time is between about 30 seconds and about 90 seconds, such as about 60 seconds. In one embodiment, process fluid continues to flow during iFGPEB processing. In this embodiment, the volume of the process volume 104 is exchanged between about 1 time and about 10 times per substrate processed. In another embodiment, the process fluid is predominantly static during processing. In this embodiment, the volume of the process volume 104 is not exchanged during substrate processing of each substrate.

In another operational embodiment, a first flow rate is utilized to initially fill the process volume 104. The first flow rate is less than 5 L/min for an amount of time to fill the process volume 104 such that the first fluid ports 126 are submerged. A second flow rate of greater than 5 L/min is them utilized to fill the remainder of the process volume 104. During application of electric field in iFGPEB processing, a third flow rate of less than 5 L/min is utilized. The flow rate modulation between the first and second flow rates is configured to reduce turbulence of the fluid with in the process volume 104 and reduce or eliminate the formation of bubbles therein. However, if bubbles are formed, the buoyancy of the bubbles enables the bubbles to escape from the process volume 104 via the second fluid ports 128, thereby minimizing the insulating effect of the bubbles on the electric field during iFGPEB processing. Accordingly, a more uniform electric field may be achieved to improve iFGPEB processing.

Figure 4:
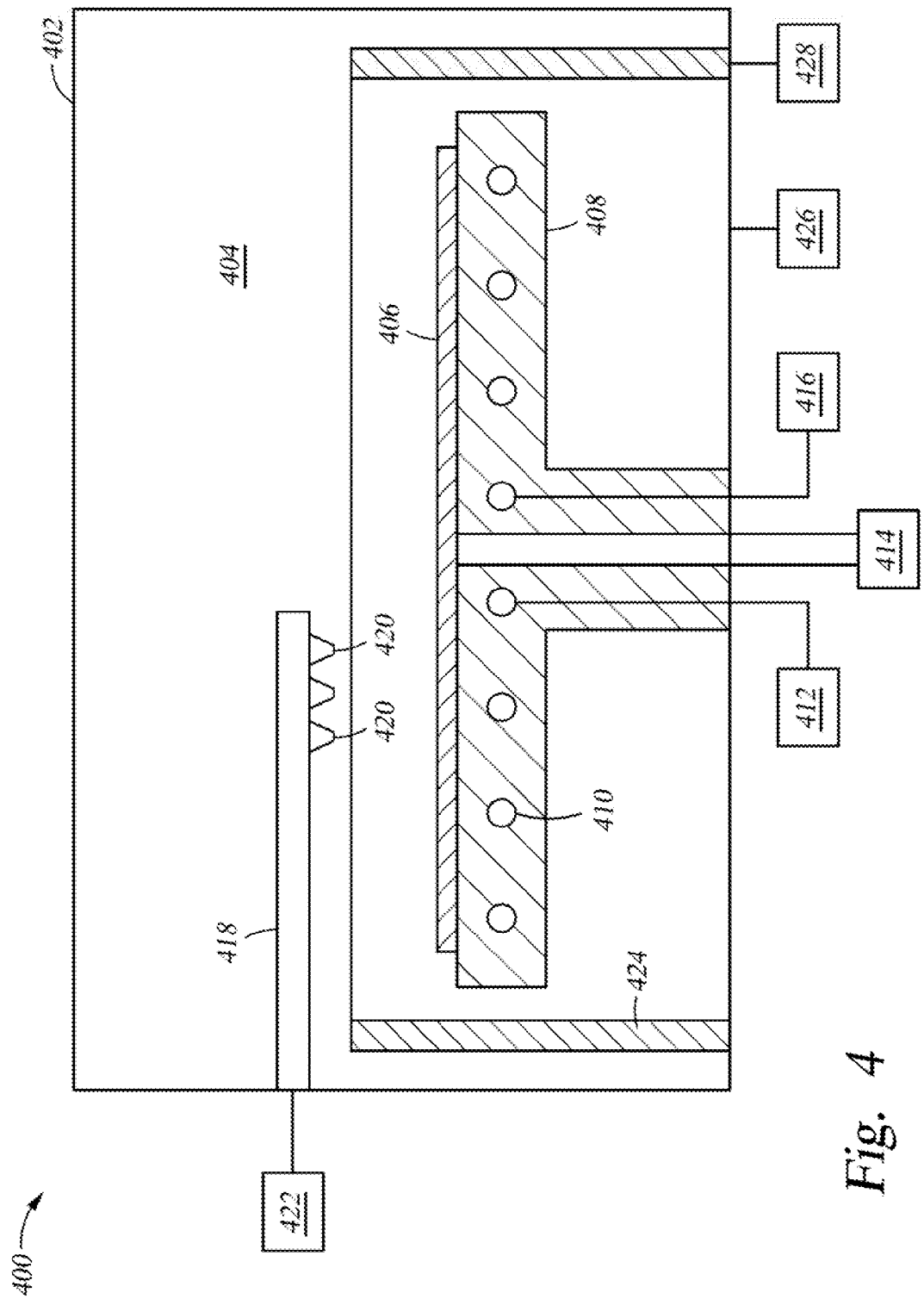
FIG. 4 illustrates a post process chamber according to embodiments described herein.

FIG. 4 illustrates a post process chamber 400 according to embodiment described herein. After iFGPEB processing of a substrate in the process chamber 100, the substrate is transferred to the post process chamber 400. The post process chamber 400 includes a chamber body 402 defining a process volume 404 and a pedestal 408 disposed in the process volume 404. A substrate 406 positioned on the pedestal 408 is post processed by cooling and rinsing the substrate 406. By combining cooling and rinsing, the bake to cool delay of substrate processing is minimized.

When the substrate 406 is positioned on the pedestal 408, the substrate is vacuum chucked by application of vacuum from a vacuum source 414. Cooling of the substrate 406 begins once the substrate 406 is chucked. Fluid conduits 410 are formed in the pedestal 408 and the fluid conduits 410 are in fluid communication with a cooling fluid source 412. Cooling fluid is flowed through the fluid conduits 410 to cool the substrate 406.

During cooling, the substrate 406 is also rinsed to remove any remaining process fluid still present on the substrate surface. Rinse fluid is dispensed onto the device side of the substrate 406 from a fluid delivery arm 418 which may include fluid delivery nozzles 420. Rinse fluid, such as de-ionized water or the like, is provided from a rinse fluid source 422 via the arm 418 and the nozzles 420.

After rinsing and cooling, the substrate 406 is spin dried by rotating the pedestal 408. The pedestal 408 is coupled to a power source 416 which enables rotation of the pedestal 408. During spin drying of the substrate 406, a shield 424 is raised to collect fluid spun off of the substrate 406. The shield 424 is ring like in shape and sized with an inner diameter greater than a diameter of the pedestal 408. The shield 424 is also disposed radially outward of the pedestal 408. The shield 424 is coupled to a motor 428 which raises and lowers the shield 424 such that the shield 424 extends above the substrate 406 during spin drying. Fluid collected during spin drying by the shield 424 is removed from the process volume 404 via a drain 426. It is noted that during cooling and rinsing of the substrate 406, the shield 424 may be disposed in a lowered position and subsequently raised during spin drying of the substrate 406. The shield 424 may also be lowered during loading and unloading of the substrate 406.

Once the substrate 406 has been dried, resist on the substrate 406 is developed by the application of a developer, such as tetramethylammonium hydroxide (TMAH). In one embodiment, the developer is dispensed from the arm 418 and nozzles 420. After development, the substrate 406 may optionally be rinsed with deionized water and dried again to prepare the substrate 406 for subsequent processing.

Figure 5:
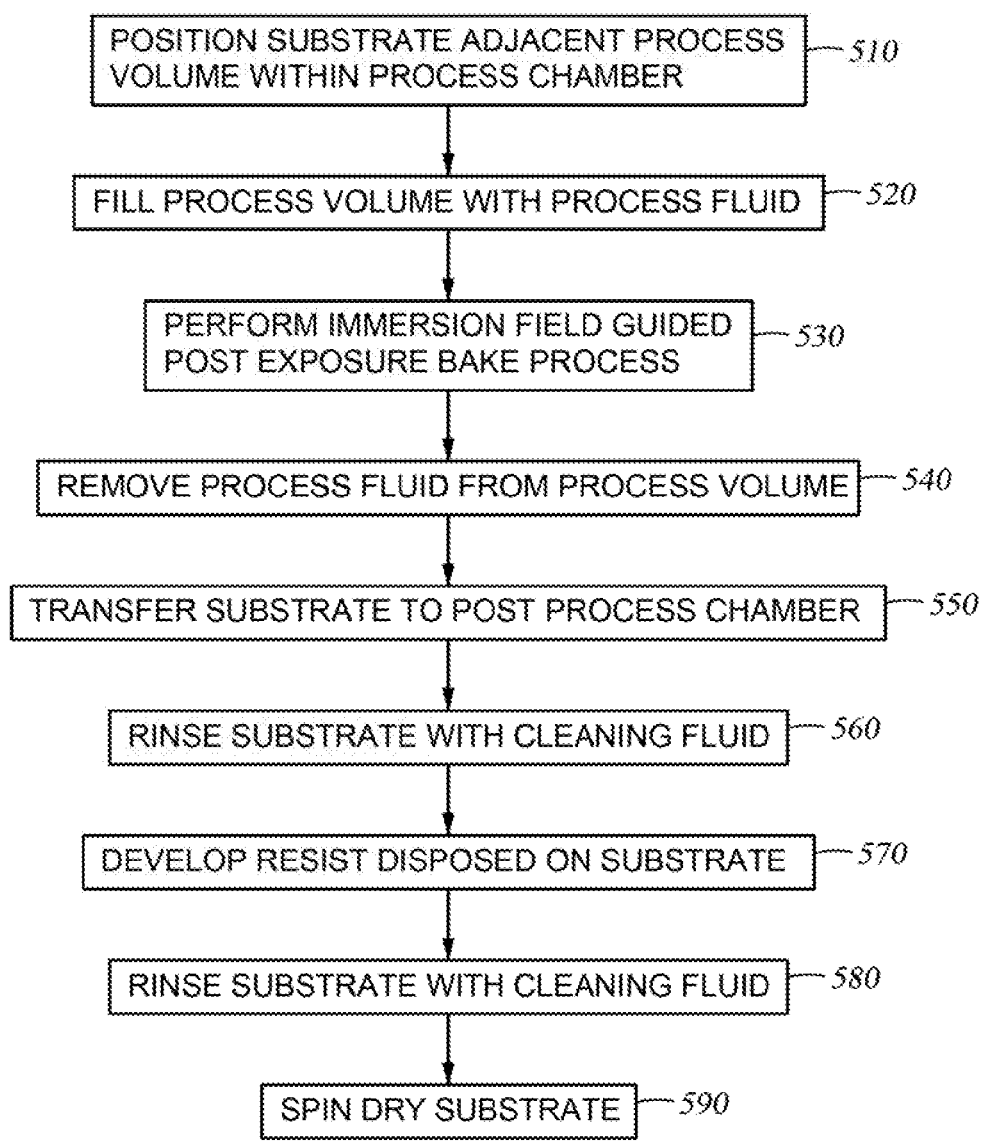
FIG. 5 illustrates operations of a method for processing substrates according to embodiments described herein.

FIG. 5 illustrates operations of a method 500 for processing substrates according to embodiments described herein. At operation 510, a substrate is positioned adjacent or within the process volume of a process chamber, such as the process chamber 100. The process volume is filled with process fluid at operation 520 and iFGPEB processing is performed at operation 530. At operation 540, process fluid is removed from the process volume and the substrate is transferred to a post process chamber, such as the post process chamber 400, at operation 550. Optionally, the substrate may be spin dried during operation 540 to prevent spillage of process fluid during substrate handling.

At operation 560, the substrate is rinsed with cleaning fluid to remove process fluid from the substrate. Operation 560 may also include spin drying of the substrate in certain embodiments. At operation 570, resist disposed on the substrate is developed and at operation 580, the substrate is again rinsed with cleaning fluid. At operation 590, the substrate is spin dried and prepared for subsequent processing.

In summation, apparatus and method for improving iFG-PEB processing are provided. Process chambers described herein enable efficient use of process fluid and improved application of electric field during iFGPEB operations. Post processing of a substrate is also improved by reducing the bake to cool delay by utilizing apparatus which enables concurrent cooling and rinsing operations. Thus, iFGPEB processing operations can be improved by utilizing the apparatus and methods described herein.

While the foregoing is directed to embodiments of the present disclosure, other and further embodiments of the disclosure may be devised without departing from the basic scope thereof, and the scope thereof is determined by the claims that follow.

What is claimed is:

1. A substrate processing apparatus, comprising:
    a chamber body defining a process volume, wherein a major axis of the process volume is oriented vertically and a minor axis of the process volume is oriented horizontally;
    a moveable door coupled to the chamber body;
    a first electrode coupled to the door and a seal coupled to the first electrode, wherein the seal is configured to contact a backside of a substrate when a frontside of the substrate is disposed adjacent to the process volume;
    a second electrode coupled to the chamber body, the second electrode at least partially defining the process volume;
    a first plurality of fluid ports formed in a sidewall of the chamber body adjacent the process volume; and
    a second plurality of fluid ports formed in the sidewall of the chamber body adjacent the process volume opposite the first plurality of fluid ports.

2. The apparatus of claim 1, further comprising:
    a backing plate disposed between the first electrode and the door.

3. The apparatus of claim 1, further comprising:
    a process fluid source in fluid communication with the process volume via a first plurality of channels and the first plurality of fluid ports.

4. The apparatus of claim 3, further comprising:
    a fluid outlet in fluid communication with the process volume via a second plurality of channels and the second plurality of fluid ports.

5. The apparatus of claim 3, wherein 21 channels of the first plurality of channels are formed in the chamber body.

6. The apparatus of claim 4, wherein 21 channels of the second plurality of channels are formed in the chamber body.

7. The apparatus of claim 1, wherein the first electrode is configured to vacuum chuck the substrate thereon.

8. The apparatus of claim 7, wherein a vacuum source is in fluid communication with the first electrode.

9. The apparatus of claim 1, wherein the chamber body is formed from polytetrafluoroethylene.

10. The apparatus of claim 1, wherein the first plurality of fluid ports are distributed evenly across a diameter of the process volume.

11. The apparatus of claim 10, wherein a diameter of each of the ports of the first plurality of fluid ports is between about 3.0 mm and about 3.5 mm.

12. The apparatus of claim 10, wherein the second plurality of fluid ports are distributed evenly across the diameter of the process volume.

13. The apparatus of claim 12, wherein a diameter of each of the ports of the second plurality of fluid ports is between about 3.0 mm and about 3.5 mm.

14. The apparatus of claim 2, wherein a width of the process volume is between about 4.0 mm and about 4.5 mm.

15. The apparatus of claim 1, wherein the seal is positioned on the first electrode adjacent to a region corresponding to an outer diameter of the substrate.

16. The apparatus of claim 1, further comprising:
    a second seal coupled to the first electrode adjacent an outer diameter of the first electrode, wherein the second seal contacts a surface of a sidewall of the chamber body.

17. The apparatus of claim 1, further comprising:
    a third seal coupled to an outer diameter of the second electrode, wherein the third seal is positioned in contact with a sidewall of the chamber body.

18. A substrate processing apparatus, comprising:
    a chamber body defining a process volume, wherein a major axis of the process volume is oriented vertically and a minor axis of the process volume is oriented horizontally;
    a moveable door coupled to the chamber body;
    a first electrode coupled to the door, the first electrode configured to support a substrate thereon;
    a first O-ring coupled to the first electrode, wherein the first O-ring is positioned to contact a backside of the substrate adjacent to an outer diameter of the substrate;
    a second O-ring coupled to the first electrode adjacent to an outer diameter of the first electrode, wherein the second O-ring contacts a surface of a sidewall of the chamber body;
    a second electrode coupled to the chamber body, the second electrode at least partially defining the process volume;
    a first plurality of fluid ports formed in a sidewall of the chamber body adjacent the process volume; and
    a second plurality of fluid ports formed in the sidewall of the chamber body adjacent the process volume opposite the first plurality of fluid ports.

19. The apparatus of claim 18, further comprising:
    a third O-ring coupled to an outer diameter of the second electrode, wherein the third O-ring is positioned in contact with a sidewall of the chamber body.

20. A substrate processing apparatus, comprising:
    a chamber body defining a process volume, wherein a major axis of the process volume is oriented vertically and a minor axis of the process volume is oriented horizontally;
    a moveable door coupled to the chamber body;
    a first electrode coupled to the door, the first electrode configured to support a substrate thereon;
    a second electrode coupled to the chamber body, the second electrode at least partially defining the process volume;
    a first O-ring coupled to the first electrode, wherein the first O-ring is positioned to contact a backside of the substrate;

a second O-ring coupled to an outer diameter of the second electrode, wherein the second O-ring is positioned in contact with a sidewall of the chamber body;
a first plurality of fluid ports formed in the sidewall of the chamber body adjacent the process volume; and
a second plurality of fluid ports formed in the sidewall of the chamber body adjacent the process volume opposite the first plurality of fluid ports.

\* \* \* \* \*